United States Patent [19]
Lundberg et al.

[11] Patent Number: 5,881,376
[45] Date of Patent: Mar. 9, 1999

[54] DIGITAL CALIBRATION OF A TRANSCEIVER

[75] Inventors: Jan-Erik Lundberg, Sollentuna; Anders Staaf, Stockholm, both of Sweden

[73] Assignee: Telefonaktiebolaget LM Ericsson, Stockholm, Sweden

[21] Appl. No.: 573,543

[22] Filed: Dec. 15, 1995

[51] Int. Cl.[6] .................................................. H04B 17/00
[52] U.S. Cl. .................... 455/226.1; 455/67.4; 455/115; 455/114; 455/296; 375/296; 375/346
[58] Field of Search .................................. 375/296, 297, 375/285, 346; 455/103, 114, 115, 126, 127, 296, 63.7, 324, 67.1, 67.4, 226.1, 226.2; 330/149; 341/144, 155

[56] References Cited

U.S. PATENT DOCUMENTS

| | | | |
|---|---|---|---|
| 4,291,277 | 9/1981 | Davis et al. | 375/297 |
| 4,700,151 | 10/1987 | Nagata | 375/297 |
| 5,093,637 | 3/1992 | Isota et al. | 375/297 |
| 5,105,445 | 4/1992 | Karam et al. | 375/296 |
| 5,249,203 | 9/1993 | Loper | 455/324 |
| 5,313,656 | 5/1994 | Vaisanen et al. | 455/67.4 |
| 5,351,016 | 9/1994 | Dent | 375/296 |
| 5,396,190 | 3/1995 | Murata | 375/296 |

OTHER PUBLICATIONS

K. Sam Shanmugam, "Digital And Anaolg Communication System", pp. 518–523, 1979.

*Primary Examiner*—Nguyen Vo
*Attorney, Agent, or Firm*—Burns, Doane, Swecker & Mathis, L.L.P.

[57] ABSTRACT

Methods and systems for calibrating transceivers are described. Analog transceiver components create errors, such as gain and offset errors in a receiver or a transmitter portion, which are compensated by adjusting digital signal processing in the computing portion of the transceiver. Errors can be measured in a calibration procedure and determined compensating values stored in a memory device of the transceiver. These values can then be retrieved when the transceiver is initialized for usage during signal processing of signals received by and transmitted by the transceiver.

5 Claims, 7 Drawing Sheets

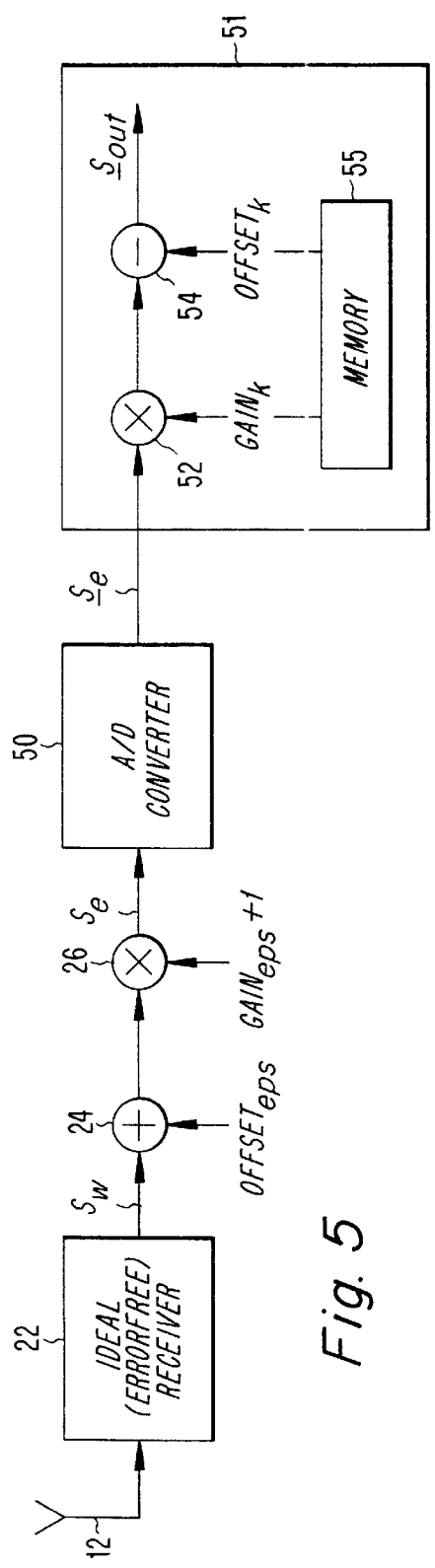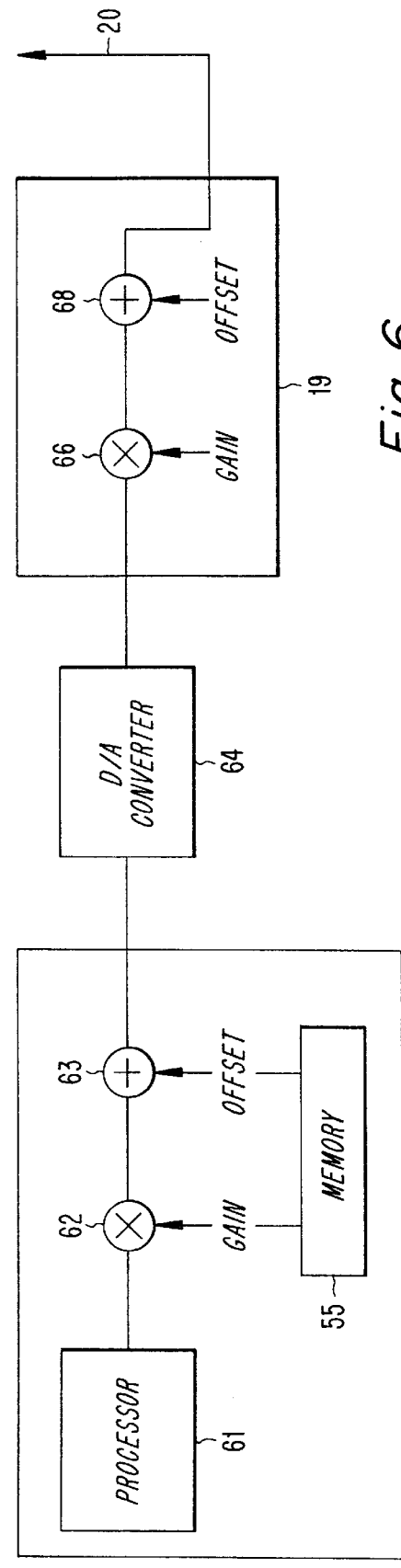

DIGITAL CALIBRATION OF A TRANSCEIVER

BACKGROUND

The present invention is directed generally to radiocommunication systems and, more particularly, to techniques and structures for calibrating transceivers used in radiocommunication systems.

The first cellular mobile radio systems in public use were analog systems used to convey speech or other analog information. These systems comprised multiple radio channels for transmitting analog information between base and mobile stations by transmitting analog-modulated radio signals. More recently, digital systems have been implemented due to, for example, their promise of increased system capacity premised on their greater ability to tolerate interference. For example, in a time division multiple access (TDMA) radiocommunication system, each frequency can support a plurality of time-multiplexed channels, while in code division multiple access (CDMA) signals are encoded to such a degree that a high level of self interference is tolerable. Due to large existing customer bases having analog-only terminal equipment, dual-mode systems which support both analog and digital channels are becoming increasingly popular in certain areas. In the U.S., for example, systems specified by the EIA/TIA IS-54B publication are dual-mode systems.

In an analogous manner, digital signal processing (DSP) has become more prevalent in the radiocommunication industry for a variety of reasons. For example, unlike analog circuits, the operation of digital circuits does not depend on precise values of the digital signals. That is, since binary zeros and ones can be represented by significantly different voltages, the precision at which such voltages are held need not be very great. As a result a digital circuit is much less sensitive to the tolerances of component values and is also fairly independent of temperature, aging and other external parameters. The accuracy of digital circuits is thus much more reliable.

One part of the radiocommunication industry where the prevalence of DSP is having a significant impact is the design of radio transceivers. A transceiver, which is a combined transmitter and receiver, is used for transmitting and receiving signals over an air interface, e.g., between a base station and mobile station in a cellular system. Although the signals being transmitted and received are analog signals, the modulation may be of either analog or digital type, and the information carried by the signal will be digitally processed. Thus, a transceiver that uses digital signal processing techniques in a radiocommunication system is denoted a digital transceiver in this specification, although it may still contain analog parts, such as amplifiers and filters (and sometimes synthesizers and mixers), and regardless of whether the radio signals to be processed by the transceiver use analog or digital modulation.

In FIG. 1 a conventional digital transceiver 10 is shown schematically. Therein, a receive antenna 12 is used to capture signals transmitted over the air interface from, for example, other base stations and mobile stations (not shown). The received signals are input to analog receiver 14. Analog receiver 14 can include, for example, receive filters, downconverters and amplifiers for processing the signals received via antenna 12. However, many functions associated with processing received signals may not be included in block 14 as these functions are now performed using digital signal processing as described below. Accordingly, after being processed by the analog components of receiver 14, the output signal is provided to A/D converter 16 which transforms the analog signal into a digital signal. This allows digital computing part 17 to operate on the received signal and complete the signal processing which was not performed by analog receiver 14. For example, digital computing part 17 can be used to perform demodulation and decoding of the received signal.

On the transmitter side, digital computing part 17 performs various DSP routines which are used to prepare a signal for transmission, e.g., encoding and modulation. The digital signal output from digital computing part 17 is then input to a D/A converter 18 which transforms the digital signal into an analog signal. This analog signal is then received by analog transmitter 19 which includes various analog components that complete the signal processing for transmission by, for example, filtering, frequency upconverting and amplifying the signal before it is coupled to transmitting antenna 20.

Despite the fact that the number of analog components used in digital transceiver 10 have been reduced (i.e., by the substitution of DSP routines which perform signal processing tasks previously performed by additional analog components), the remaining analog parts (i.e., those denoted by blocks 14 and 19 in FIG. 1) continue to suffer from the imperfections described above. These imperfections result in gain and offset errors being introduced into the signals which are output from blocks 14 and 19.

To exemplify how such errors are introduced and how they are compensated according to a conventional solution, a model of an analog receiver will be studied in more detail. Those skilled in the art will appreciate that signals described herein are typically mathematically complex, i.e., with real and imaginary components. Accordingly, complex mathematics (e.g., complex-conjugation) is typically used to describe operations on these signals. However, to simplify this description the complex nature of signal operations is not shown explicitly in the equations and figures presented herein.

As mentioned above, an analog receiver normally suffers from a number of imperfections. Some of these imperfections create signal errors, such as gain errors and offset errors, that can be introduced to the wanted signal. FIG. 2 models how an analog receiver introduces an offset error and a gain error to a wanted signal $S_w$. Therein, received signals are again captured by antenna 12. In the model of FIG. 2, ideal processing performed by receiver 14 is represented by block 22 which outputs the wanted signal $S_w$, i.e., block 22 represents the effects of ideal analog components which have none of the imperfections described above. Signal processing blocks 24 and 26 represent the total offset and gain errors introduced onto the wanted signal $S_w$ by imperfections associated with the analog components of receiver 14. More specifically, block 24 represents the introduction of offset errors to the wanted signal and block 26 represents the effects of gain errors introduced by the analog components. The output signal, with introduced errors, is then represented by erroneous signal $S_o$. Thus, the erroneous signal $S_o$ output by the receiver can be expressed as:

$$S_o = (1 + \text{Gain}_{eps})(S_w + \text{Offset}_{eps})$$

where:
$S_w$=Wanted signal
$S_o$=Erroneous signal
$\text{Offset}_{eps}$=Amplitude of the composite offset error $Gain_{eps}$ = Amplitude of the composite gain error In a conventional receiver errors are typically compensated at the stage where they arise, using adjustment potentiometers and other adjustable analog components. FIG. 3 illustrates the principles of conventional calibration. Therein, the same reference numerals are used to denote the elements which were previously described with respect to FIG. 2. However, FIG. 3 also includes an offset compensation factor, $Offset_k$, and a compensating gain factor, $Gain_k$.

By adjusting the variable analog components to have values $Offset_k = Offset_{eps}$ and $Gain_k = (1 + Gain_{eps})^{-1}$, the equality $S_{out} = S_w$ will be achieved, whereby the receiver will be calibrated. The signal $S_{out}$ will then be fed through the A/D converter 16 to the digital computing part 17 for further processing.

As mentioned above, conventional calibration techniques rely upon the inclusion of adjustable components to compensate for errors introduced by analog components' imperfections. These adjustable components are used to realize the adjustments modelled by $Offset_k$ and $Gain_k$. A more specific example of conventional calibration which illustrates this usage of adjustable components will now be described in terms of a transmitter portion of a digital transceiver. One example of an analog modulator for modulating analog data onto a carrier is the conventional quadrature modulator illustrated in the block diagram of FIG. 4. Quadrature modulators take advantage of the quadrature phases of sine and cosine waves to modulate twice the information on the radio carrier wave. For example, the even bits in a digital information datastream can be modulated on the cosine wave, and the odd bits in the digital information datastream can be modulated onto the sine wave.

In FIG. 4, the analog quadrature modulator includes an "in-phase" or I modulator 40, a "quadrature" or Q modulator 41, and a phase-splitting network 42 for supplying cosine and sine carrier frequency signals, respectively. Ideally, the signals provided by the network 42 are $\cos(\omega t)$ and $\sin(\omega t)$, where $\omega$ is the carrier signal's angular frequency. Also shown in FIG. 4 are an I and Q modulation generator 43 for supplying I and Q modulation signals, a combination network 44 for adding the outputs of the I modulator 40 and the Q modulator 41, and trim potentiometers 45, 46 for carrier balance/d.c. offset adjustments for the I and Q signals, respectively. Additional trim potentiometers 47, 48 for amplitude matching the I and Q signals, respectively, are also shown in FIG. 4. The phase-splitting network 42 may also be adjustable, as indicated by the diagonal arrows through trim potentiometers 47 and 48, to achieve as nearly as possible the desired 90° phase difference between the sine and cosine carrier frequency signals.

The block diagram of FIG. 4 shows one exemplary way in which adjustable, analog components have been used to conventionally calibrate an analog device. However, these types of conventional calibration techniques rely upon the adjustment of potentiometers, capacitors and inductors during manufacturing. As will be recognized by those skilled in the art, this calibration process is both costly and unreliable. Moreover, there are certain types of errors which cannot be easily compensated for using these conventional techniques, e.g., in-band filter ripple. In-band filter ripple refers to the variation in the sensitivity of a receiver when tuning to different frequencies or channels within the transceiver's frequency range. This ripple is caused by the presence of band-limiting filters which are used in the receiver to remove strong, out-of-band signals. Unfortunately, in-band ripple can lead to a variety of difficulties, including inaccurate signal strength measurements.

SUMMARY

These and other drawbacks and limitations of conventional methods and systems for calibrating transceivers are overcome according to the present invention. According to exemplary embodiments of the present invention, errors introduced by the analog components in the digital transceiver, i.e., in the analog receiver portion and in the analog transmitter portion, are compensated in a digital computing part. That is, during the processing of signals which are received (or are to be transmitted) by digital signal processing routines, compensating coefficients can be inserted into the calculations to offset the errors that have been or will be introduced by the analog components of the digital transceiver.

According to one aspect of the present invention, ranges of the A/D and D/A converters used in a digital transceiver are selected so that errors are properly transferred between the analog and digital sections. This allows the digital compensation to be provided accurately.

According to another aspect of the present invention, various techniques are described for determining the calibration values which will be used to adjust signal values to compensate for errors introduced by analog components. These calibration values can then be stored in a memory in the transceiver and retrieved for usage in digital signal processing routines.

BRIEF DESCRIPTION OF THE DRAWINGS

The foregoing, and other, objects, features and advantages of the present invention will be more readily understood upon reading the following detailed description in conjunction with the drawings in which:

FIG. 5 is a block diagram modelling calibration in a receiver according to an exemplary embodiment of the present invention;

FIG. 6 is a block diagram modelling calibration in a transmitter according to an exemplary embodiment of the present invention;

DETAILED DESCRIPTION

Figure 1:
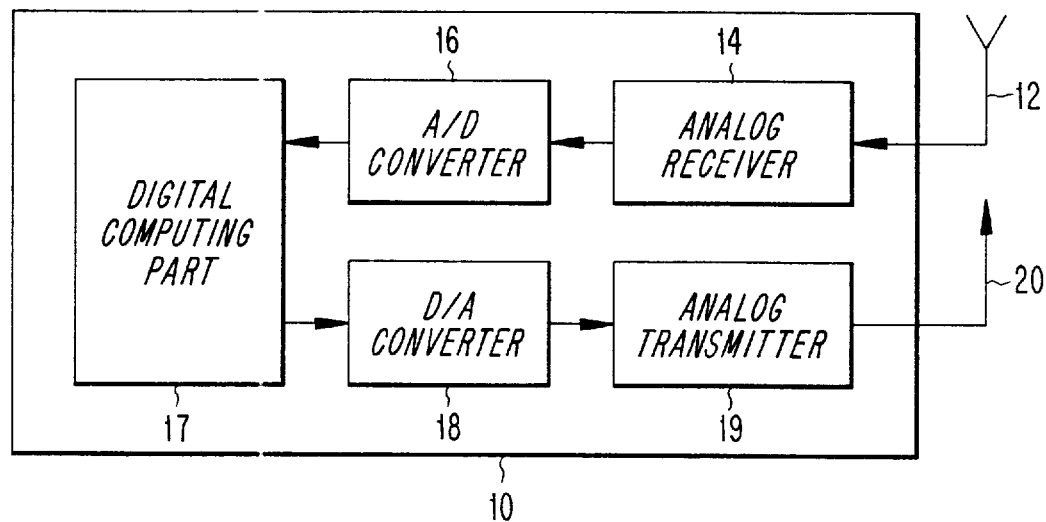
FIG. 1 is a block diagram generally illustrating portions of a conventional digital transceiver.
Figure 2:
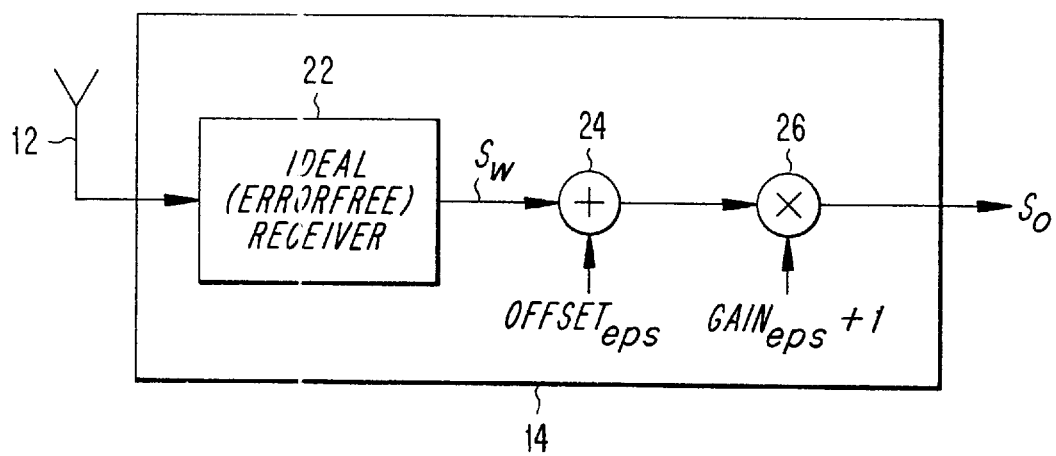
FIG. 2 is a block diagram modelling errors introduced by an analog receiver.

Those skilled in the art will appreciate that the inventive concepts disclosed herein relating to compensating for errors introduced by analog radio components in a digital computing part are reciprocal in the sense that they are applicable both to the receiver portion and to the transmitter portion of a digital transceiver. Accordingly, although various portions of the text below provide different examples in the context of the receiver portion and of the transmitter portion individually, it should be understood that the teachings of each example can also be applied to the other portion not explicitly described therein.

According to an exemplary embodiment of the present invention, in a receiver portion of the transceiver the uncalibrated signal is fed through the A/D converter, whereupon errors introduced by the analog receiver are compensated for by the digital computing part. FIG. 5 illustrates this concept by way of a block diagram.

In FIG. 5, the notation $\underline{S}_{out}$ denotes the digital representation of the analog signal $S_{out}$. Like the foregoing figures, FIG. 5 includes several elements which have been described above, the description of which is not repeated here. A/D converter 50 provides an uncalibrated digital signal $\underline{S}_c$ which is provided to digital computing part 51. A/D converter 50 may differ in range from A/D converter 16 for reasons described below. In digital computing part 51, compensating factors are applied to the uncalibrated signal $\underline{S}_c$. Specifically, a compensating gain factor, $Gain_k$, and a compensating offset factor, $Offset_k$, are applied to the uncalibrated signal at blocks 52 and 54, respectively. These values can be retrieved from a memory device 55, e.g., a non-volatile, flash memory. Thus, the digital output signal $\underline{S}_{out}$ can be calculated from $S_{out}=(S_w+Offset_{eps})(1+Gain_{eps})(Gain_k)-Offset_k$. By setting the values of $Offset_k$ and $Gain_k$ so that $Offset_k=Offset_{eps}$ and $Gain_k=(1+Gain_{eps})^{-1}$, $\underline{S}_{out}=\underline{S}_w$ will be achieved, whereby the receiver portion of the digital transceiver will be calibrated. Exemplary calibration techniques for determining, storing and retrieving appropriate values of $Offset_k$ and $Gain_k$ which will maintain these equalities are described below.

Figure 3:
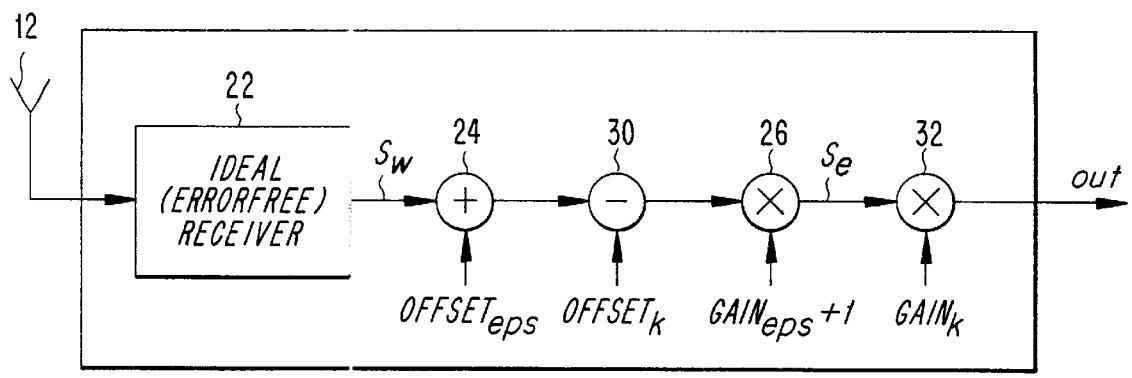
FIG. 3 is a block diagram modelling conventional calibration techniques for the analog receiver of FIG. 2.
Figure 4:
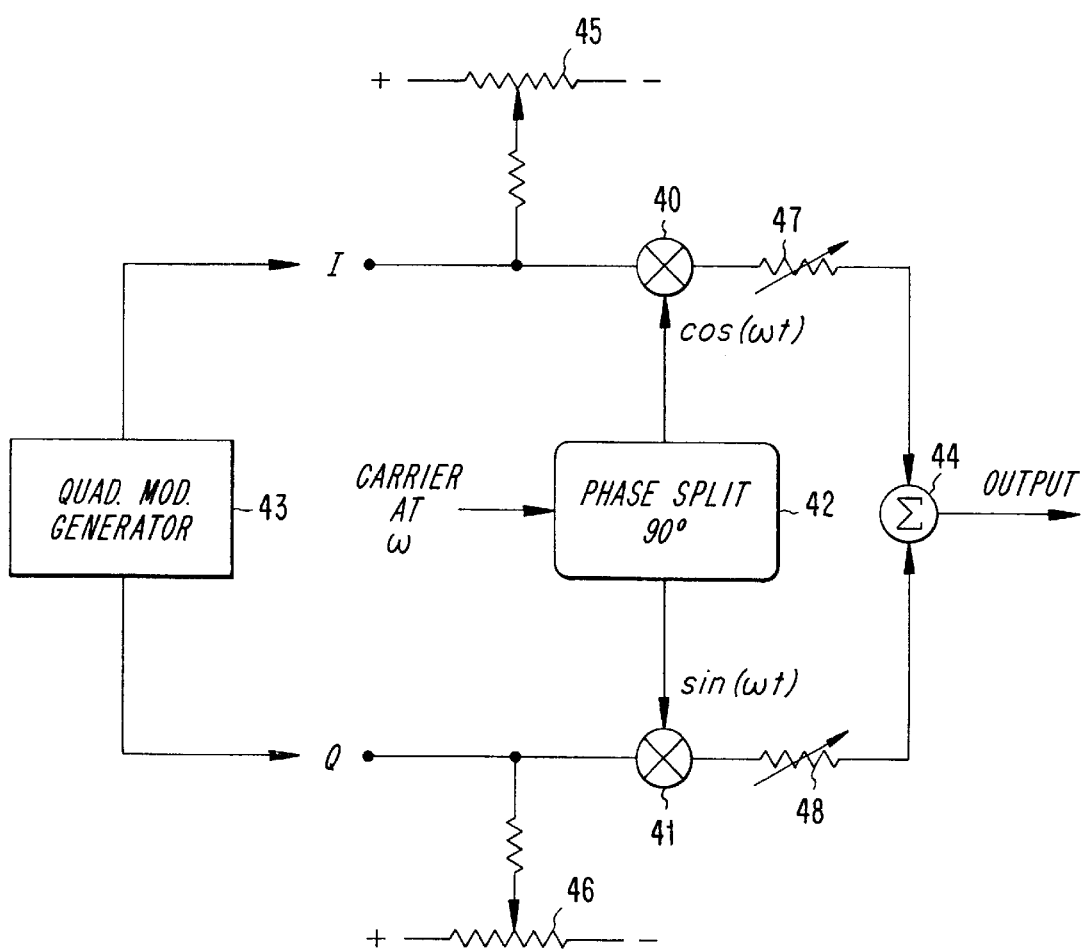
FIG. 4 is a schematic illustrating conventional calibration of an analog transmitter using adjustable components.

Notice that between introduction of the errors at blocks 24, 26 and compensation of the errors at blocks 52, 54, there takes place the intermediate process of A/D conversion at block 50. A/D conversion is performed by assigning an analog signal sample to one of a plurality of quantizing levels. For example, an 8-bit A/D converter has $2^8=256$ different quantizing levels. Since there are an infinite number of actual analog amplitude values, this conversion process introduces an error, known as a quantizing error, which has a maximum value of $\pm\frac{1}{2}$ the size of a quantizing interval. This is significant in the context of the present invention because the errors added to the wanted signal $S_w$ will affect the quantizing error inherent in signal $\underline{S}_o$ since compensation is performed downstream of the A/D converter. Compare this situation with that of the conventional solution of FIG. 3. In the conventional solution, the errors introduced by the analog circuitry do not affect the quantizing error introduced by conversion since the errors are compensated for at a point upstream of the A/D converter.

Accordingly, systems designed according to the present invention should determine an appropriate range for A/D converter 50 taking this factor into account. Thus, according to another aspect of the present invention, the range of the A/D converter 50 is sized using a model of the analog receiver with the imperfection errors included. For example, if the errors introduced by the analog receiver 14 are on the order of 5–25%, then the A/D converter 50 can be selected which is 1 bit larger, e.g., 9 bits instead of 8 bits, than the corresponding A/D converter 16 in a conventional system to provide a desired level of performance. Those skilled in the art will recognize, however, that if the errors are significantly larger, then more bits may be needed to characterize the signal.

As mentioned above, this technique is reciprocal and can also be applied to the transmitter side of digital transceiver 10. This is illustrated by the block diagram of FIG. 6. Therein digital computing part 51 also includes a processor 61 which generates signals for transmission. As will be appreciated by those skilled in the art, processor 61 can be connected to, for example, a switching unit (not shown) which forwards information to be transmitted over a radio channel to a base station in which a digital transceiver according to the present invention is located. The processor 61 performs various digital signal processing routines on the data to be transmitted, e.g., encoding and modulation. Then, a gain compensation value is applied to the signal output from processor 61 at block 62 and an offset compensation value is applied to the signal at block 63. These compensation values can be retrieved from memory 55. The output of digital computing part 51 is then applied to D/A converter 64. As described previously, D/A converter 64 can be sized according to an aspect of the present invention so that the compensation values applied to the signal to be transmitted in the digital computing part 51 do not create larger quantization errors than the uncompensated signals would have created in the conventional system of FIG. 1. Then, the analog signal is applied to the analog transmitter portion 19 wherein the gain and offset errors created by the analog components (e.g., the power amplifier, filters, etc.) affect the signal to be transmitted as modeled by blocks 66 and 68. Lastly, the signals are coupled onto transmitting antenna 20 for transmission over an air interface.

Figure 7:
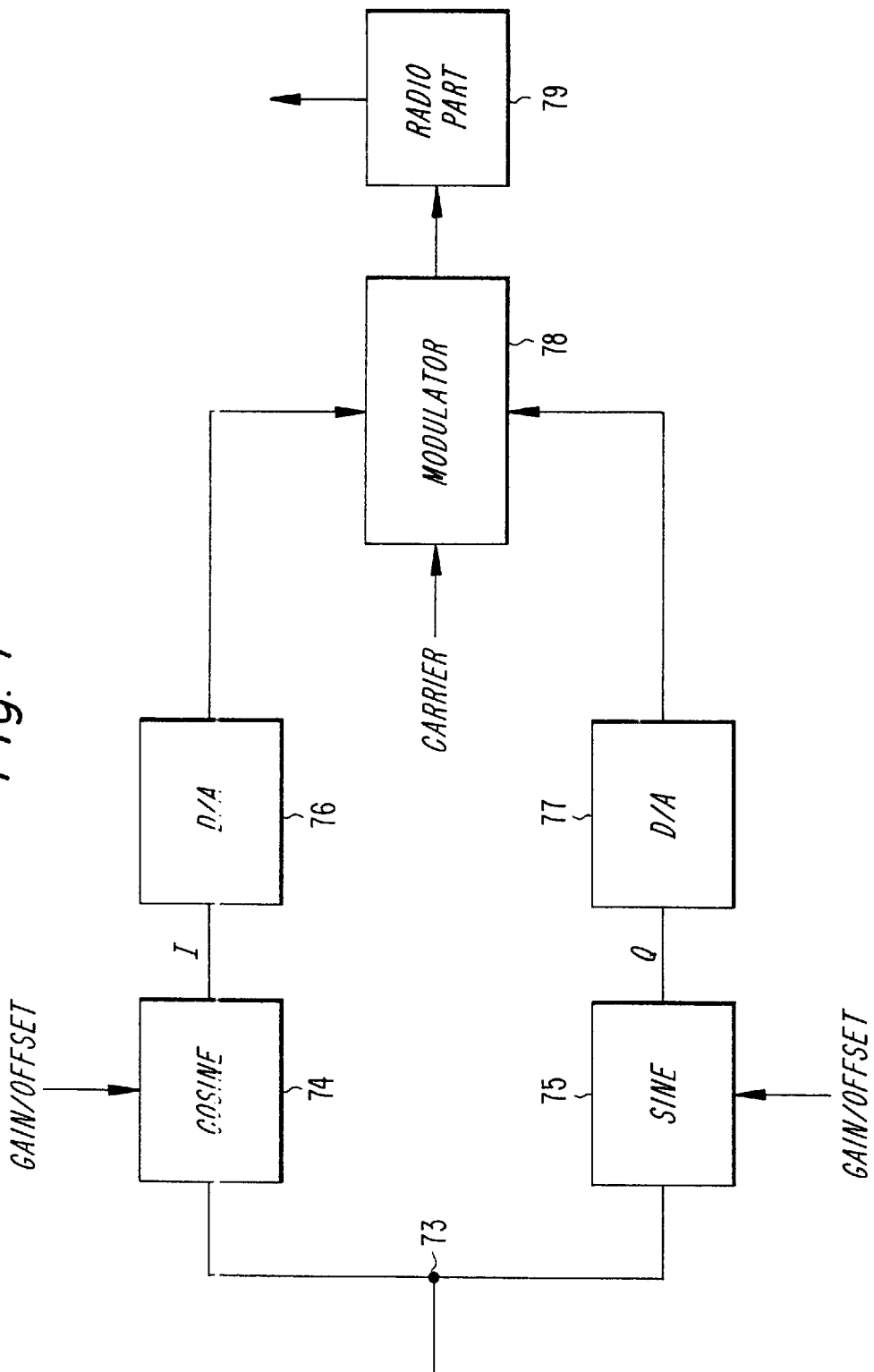
FIG. 7 is a block diagram illustrating a digital signal processing function in which calibration techniques according to the present invention can be implemented.

Having described an overview of compensation techniques according to the present invention, an exemplary implementation will now be described with respect to FIG. 7. A block diagram of an exemplary system for performing frequency modulation of a signal by first separating the signal into its I and Q components is depicted in FIG. 7. In the figure, an incoming digital signal sample stream is provided to a node 73 which sends the samples to cosine and sine component generators 74 and 75. Cosine and sine generators 74 and 75 can, for example, be implemented as DSP routines which access look-up tables (not shown). For readers interested in more details of exemplary techniques for generating sine and cosine values, U.S. patent Ser. No. 08/562,464, entitled "Method and Apparatus for Determining Signal Components Using Digital Signal Processing" to Thomas Östman et al. and filed on Nov. 24, 1995 can be consulted, the disclosure of which is expressly incorporated here by reference. The cosine and sine component information is then provided to digital-to-analog (D/A) converters 76 and 77, respectively, for conversion of the component values into corresponding analog signals. The analog signals are then modulated onto a carrier in modulator 78, whose output is provided to a radio part 79 for transmission.

The values stored in the look-up tables can be adjusted based upon the values of $Offset_k$ and $Gain_k$ which have been determined for the analog transmitter portion 19. This compensation is indicated by the gain/offset input arrows to cosine generator 74 and sine generator 75. In this way, compensation can be provided in digital computing part 51 as part of the DSP routine which performs signal modulation.

In a similar manner, compensation for errors introduced by analog receiver portion 14 can be achieved by adjusting sample magnitudes used to demodulate signals in a DSP routine performed by a digital computing part 51. Those skilled in the art will, however, appreciate that the compensation can also be performed by adjusting other values used in calculations performed by the digital computing part (e.g., DSP routines) of a digital transceiver.

Figure 8A:
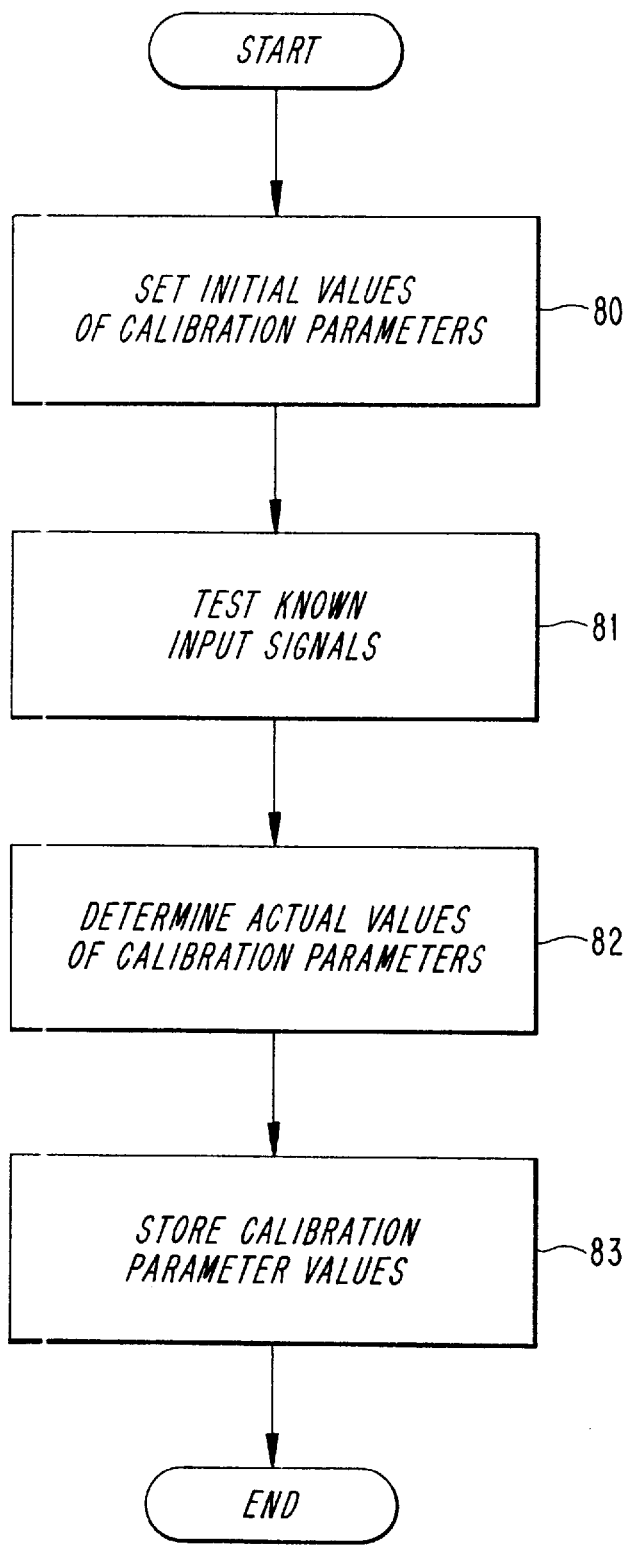
FIG. 8(a) is a flowchart illustrating an exemplary method for calibrating a transceiver according to the present invention.

The digital computing part 51 can be set in a calibration mode, whereupon the parameters $\text{Gain}_k$ and $\text{Offset}_k$ can be determined using a calibration routine. A first exemplary calibration routine is described in the flowchart of FIG. 8(a). For example, suppose that the parameters are initially set such that $\text{Gain}_k=1$ and $\text{Offset}_k=0$ at step 80. Then by using the equation $S_{out}=(S_w+\text{Offset}_{eps})(1+\text{Gain}_{eps})$ and measuring $S_{out}$ for two different signals input to the transceiver, values can be calculated for $\text{Offset}_{eps}$ and $\text{Gain}_{eps}$ at steps 81 and 82, respectively. For calibration, $S_{out}$ should be set equal to $S_w$, which means that $\text{Offset}_k$ and $\text{Gain}_k$ can be set equal to $\text{Offset}_{eps}$ and $\text{Gain}_{eps}$, respectively. The calibration values thus computed are stored in memory 55 in the digital computing part 51 of the digital transceiver at step 83.

Note that the initial values of $\text{Offset}_k$ and $\text{Gain}_k$ used in this description were chosen to simplify the explanation of an exemplary calibration routine. In an actual implementation other initial values may be chosen. For example, initial values for $\text{Offset}_k$ and $\text{Gain}_k$ can be set to typical values associated with the type of receiver used. When the receiver is operating in a non-calibration mode, the calibrated values of $\text{Offset}_k$ and $\text{Gain}_k$ can then be retrieved from the memory 55 to achieve equality between $S_{out}$ and $S_w$. This retrieval can, for example, be performed at initialization of the transceiver.

Figure 8B:
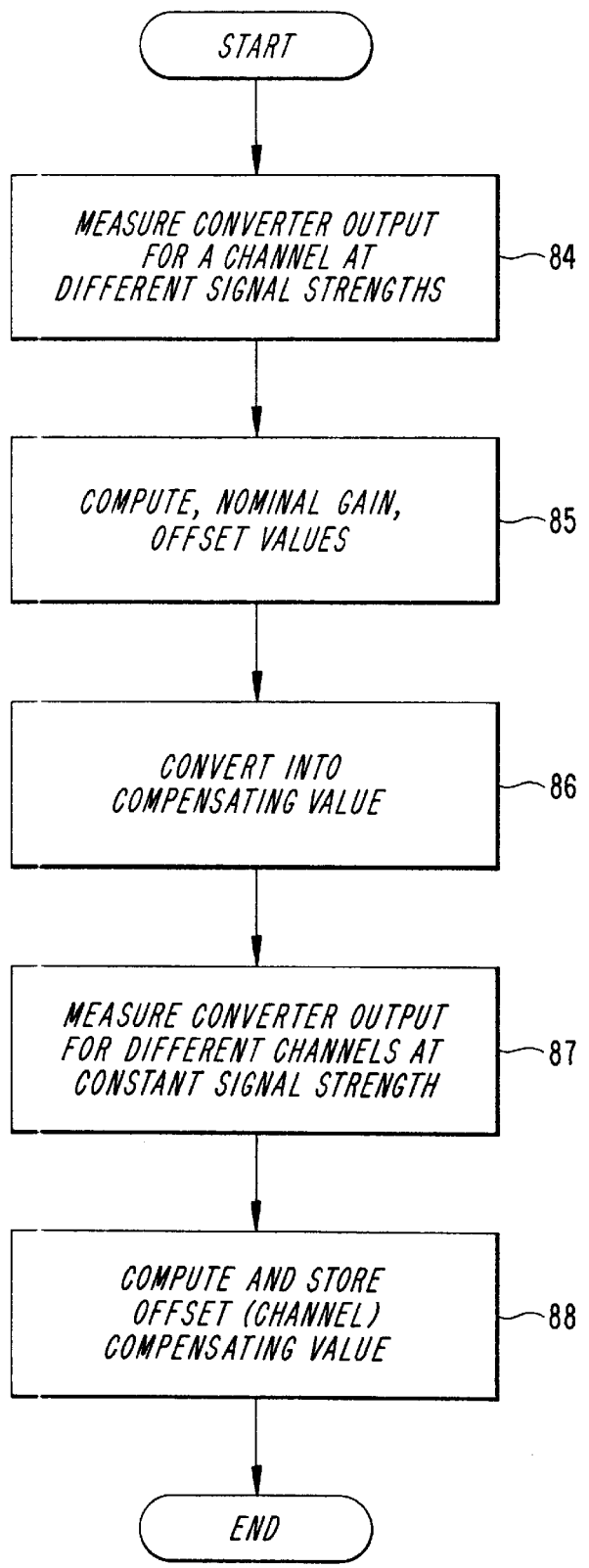
FIG. 8(b) is another flowchart illustrating another exemplary method for calibrating a transceiver according to the present invention.

The flowchart of FIG. 8(b) depicts another exemplary technique for calibrating an analog portion of a digital transceiver. In particular, offset and gain errors can be compensated by performing the steps illustrated in FIG. 8(b). First, at step 84, a signal transmitted at a particular channel frequency can be input to the receiver at each of a plurality n of different signal strengths indexed i=1 . . . n. Then, the output of the A/D converter for each of the different signal strengths can be used to determine a nominal gain value and a nominal offset value as denoted by step 85. These values can be computed using, for example, linear regression as set forth below, where a(i) denotes the converter output for each input i and d(i) denotes the signal strength of each input i.

$$K = \frac{\Sigma a(i)d(i) - \frac{(\Sigma a(i))(\Sigma d(i))}{n}}{\Sigma a(i)^2 - \frac{((\Sigma a(i))(\Sigma a(i)))}{n}}$$

$$O = \frac{\Sigma d(i)}{n} - \frac{K\Sigma a(k)}{n}$$

The nominal gain value K and nominal offset value O can then be converted into a compensating value at step 86 according to the equation $S_{corrected}=K*S+O$. The use of regression techniques in this context is well known in the art and the interested reader is referred to "Probability and Statistics in Engineering and Management Science" authored by Hines and Montgomery, e.g., pages 359–366 and "The Electrical Engineering Handbook" edited by Richard C. Dorf at pages 2511–12, the disclosure of which is incorporated here by reference. This value can be used, for example, to adjust cosine and sine values in the look-up tables (described above) so that the I and Q components determined by the demodulation signal processing routine in digital computing part 51 are adjusted to reflect errors introduced in the analog receiver portion 14. Other techniques for using the nominal values K and O to compensate for analog imperfections will be apparent to those skilled in the art.

Figure 9:
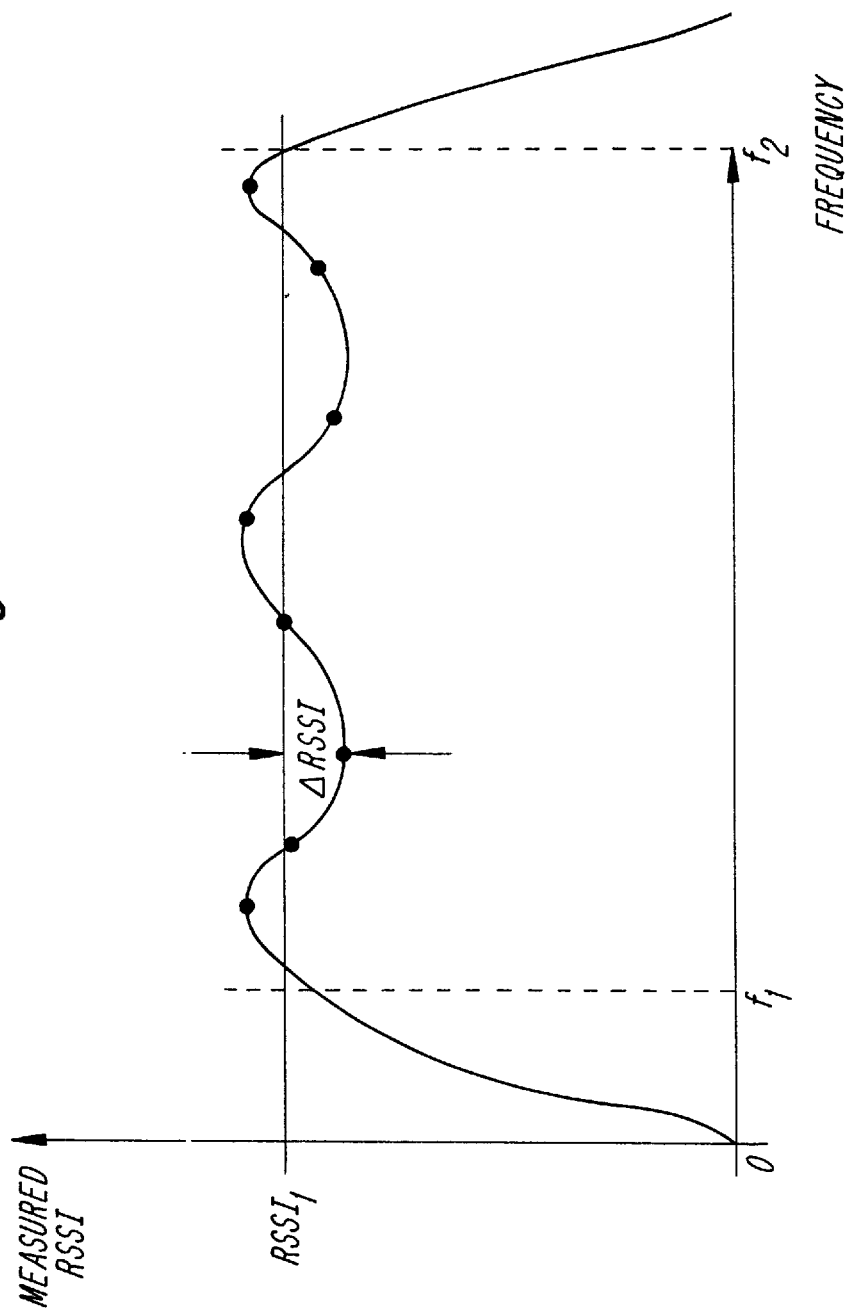
FIG. 9 is a graph illustrating in-band filter ripple and techniques according to the present invention for compensating same.

As mentioned above, certain errors may change in value as a function of frequency. For example, according to this embodiment, the in-band filter ripple errors described above can be separately compensated for by providing an additional offset compensation associated with a particular channel frequency at which the transceiver is operating. However, RSSI error attributable to in-band filter ripple is not measured for all channels, but only for a set of channels which will enable RSSI compensation for all in-band channels associated with a transceiver. From the measured channels, the rest of the channels can be compensated for using interpolation. The number of channels which are measured in the set should be chosen so that a sufficient accuracy is attained. In this exemplary embodiment eight channels are selected for measurement. This can be visualized by the graph illustrated in FIG. 9. Therein, it is desired to compensate for variations in measured signal strength attributable to in-band filter ripple. Absent in-band filter ripple, in-band measurements would closely follow the line $\text{RSSI}_1$. However, as seen in the figure, the actual measured signal strengths vary both above and below this line within the in-band frequencies f1 through f2. Accordingly, eight different frequencies are measured and the difference between the measured RSSI and the ideal RSSI are determined. For example, at step 87 of the flow chart of FIG. 8(b), the output of the A/D converter can again be measured, but this time at a plurality, e.g., eight, different channel frequencies for a single signal strength. The offset is then computed for each output of the A/D converter. Specifically, this is performed using the following equation:

Offset(channel)=(inputsignalstrength/K)−converteroutput(channel)

Then, the offset value for each channel is stored in the memory 55 at step 88. This additional offset compensating value can be used to improve the compensation described above by calculating $S_{corrected}=K_{nominal}*S+O_{nominal}+O_{channel}$. $O_{channel}$ can be a value which is determined by either using the measured offset (channel) which is closest in frequency to the channel at which the transceiver is operating or by interpolating the two offset (channel) values between which the current channel falls.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What we claim is:

1. A radio receiver comprising:

an analog radio receiver for receiving and processing a radio signal;

an A/D converter for converting said received and processed signal from said analog radio receiver into a digital signal;

a digital computing part for processing said digital signal; and a memory device for storing at least one fixed calibration value, said at least one fixed calibration value being predetermined by inputting at least one known test signal to said radio receiver and evaluating results therefrom, said memory device being connected to transfer data to said digital computing part, wherein said digital computing part uses said at least one calibration value to compensate for first errors introduced into said received and processed signal by said analog radio receiver wherein said A/D converter is selected to be an N-bit converter, wherein N is selected to compensate for quantization errors introduced into said digital signal by said first errors.

2. A radio transmitter comprising:

a digital computing part for processing an information signal to be transmitted;

a D/A converter for converting said information signal from said digital computing part into an analog signal;

an analog radio transmitting part for processing and transmitting said analog signal; and a memory device for storing at least one fixed calibration value, said at least one fixed calibration value being predetermined based upon test measurements said memory device being connected to transfer data to said digital computing part, wherein said digital computing part uses said at least one calibration value to compensate for errors to be introduced into said analog signal by said analog radio transmitting part and wherein said D/A converter is selected to be an N-bit converter, wherein N is selected to compensate for quantization errors introduced into said analog signal by said compensation performed by said digital computing part.

3. A method for calibrating and compensating a transceiver comprising the steps of:

processing a digital signal in said transceiver using digital signal processing;

reading a fixed calibration value from a memory device, said fixed calibration value being predetermined based upon an evaluation of said transceiver using at least one known input;

using said fixed calibration value in said digital signal processing routine to alter a value of said signal;

outputting said altered signal;

converting said altered signal from a digital signal to an analog signal using a D/A converter, wherein said D/A converter is dimensioned so as to compensate for quantization errors introduced into said analog signal by said fixed calibration value used by said digital signal processing;

applying said analog signal to an analog transmitter portion of said transceiver; and transmitting said analog signal over an air interface.

4. The method of claim 3, further comprising the steps of:

receiving an analog signal via an air interface;

processing said analog signal using an analog receiving portion of said transceiver; and converting said processed, analog signal into said digital signal using an A/D converter, said digital signal being processed by said digital signal processing.

5. The method of claim 4, further comprising the step of:

dimensioning said A/D converter to compensate for quantization errors introduced into said digital signal by errors associated with said analog receiving portion.

* * * * *